(12) United States Patent
Goulier et al.

(10) Patent No.: US 8,797,200 B2
(45) Date of Patent: Aug. 5, 2014

(54) DELTA-SIGMA ANALOG-TO-DIGITAL CONVERTER AND METHOD FOR OPERATING SAME

(75) Inventors: Julien Goulier, Grenoble (FR); Eric Andre, Hurtieres (FR)

(73) Assignee: ST-Ericsson SA, Plan-les-Ouates (CH)

( * ) Notice: Subject to any disclaimer, the term of this patent is extended or adjusted under 35 U.S.C. 154(b) by 0 days.

(21) Appl. No.: 13/810,644

(22) PCT Filed: Jul. 6, 2011

(86) PCT No.: PCT/EP2011/061381
§ 371 (c)(1),
(2), (4) Date: Feb. 6, 2013

(87) PCT Pub. No.: WO2012/007328
PCT Pub. Date: Jan. 19, 2012

(65) Prior Publication Data
US 2013/0194117 A1 Aug. 1, 2013

Related U.S. Application Data

(60) Provisional application No. 61/378,118, filed on Aug. 30, 2010.

(30) Foreign Application Priority Data

Jul. 16, 2010 (EP) ..................................... 10305788

(51) Int. Cl.
*H03M 3/00* (2006.01)

(52) U.S. Cl.
USPC .......................................... 341/143; 341/155

(58) Field of Classification Search
CPC .......... H03M 3/43; H03M 3/02; H03M 3/456
USPC .......................................... 341/143, 155, 172
See application file for complete search history.

(56) References Cited

U.S. PATENT DOCUMENTS

| | | | |
|---|---|---|---|
| 7,068,205 B1 | 6/2006 | Hastings et al. | |
| 7,221,302 B1 * | 5/2007 | Melanson | ...................... 341/143 |
| 7,423,567 B2 * | 9/2008 | Melanson | ...................... 341/143 |
| 2005/0116850 A1 * | 6/2005 | Hezar et al. | ..................... 341/143 |
| 2008/0055141 A1 | 3/2008 | Ryu | |

OTHER PUBLICATIONS

Davis, C., et al., "A 14-Bit High-Temperature ΣΔ Modulator in Standard CMOS." IEEE Journal of Solid-State Circuits, vol. 38, No. 6, Jun. 1, 2003. pp. 976-986. IEEE, Piscataway, NJ.

* cited by examiner

*Primary Examiner* — Jean B Jeanglaude
(74) *Attorney, Agent, or Firm* — Coats & Bennett, PLLC

(57) ABSTRACT

A delta-sigma analog-to-digital converter generates a digital signal as a function of an analog signal and a clock signal having a first phase and a second phase. The converter includes a first branch that applies an analog input signal, a feedback branch having a digital-to-analog converter that feeds back an analog reference signal, a loop filter, a quantizer, and a switch. The switch includes, and is timely correlated with, an output switch of the digital-to- analog converter. The switch functions to connect an input resistance on the first branch and disconnect the digital-to-analog converter during the first phase, and disconnects the input resistance and connects the digital-to-analog converter during the second phase.

5 Claims, 4 Drawing Sheets

DELTA-SIGMA ANALOG-TO-DIGITAL CONVERTER AND METHOD FOR OPERATING SAME

FIELD OF THE INVENTION

The present invention relates to the field of analog-to-digital converters and methods for operating the same. The present invention relates more particularly to a delta-sigma analog-to-digital converter and a method for operating the same.

BACKGROUND OF THE INVENTION

As illustrated on FIGS. 1 and 2, delta-sigma analog-to-digital converters 1 for generating a digital signal 100 as a function of a first analog signal 101 and a clock signal having a first phase and a second phase are well-known which comprise:
- a first branch 11 on which is arranged an input resistance 111 for applying a second analog input signal 1011,
- a feedback branch 12 for feeding back a third analog reference signal 1012, said feedback branch including a digital-to-analog converter 121 arranged for generating said third analog reference signal as a function of the digital signal,
- a loop filter 13 for generating an integrated signal 103 as a function of said first analog signal, said loop filter being coupled to a branch point 14 of said first and feedback branches for receiving said first analog signal, and
- a quantizer 15 for generating said digital signal as a function of said integrated signal, the quantizer being coupled to the loop filter for receiving the integrated signal and coupled to said feedback branch for delivering said digital signal to said digital-to-analog converter.

Such delta-sigma analog-to-digital converters allow to achieve a high-speed and high-resolution analog-to-digital conversion, without requiring front-end sampling/hold elements (but only an input resistance 111) and with presenting an intrinsic anti-aliasing filter. Moreover, the use of said digital-to-analog converter implemented with a switched-capacitor circuit 1211 allows to reduce significantly the sensitivity to clock jitter. Thus, such switched-capacitor circuit is often privileged. Unfortunately, such digital-to-analog converter increases the power consumption of the delta-sigma analog-to-digital converters 1, to be able to conserve the conversion resolution. The reason of this drawback is explained hereafter.

In order to guarantee a satisfying input voltage/current conversion, the input potential of the loop filter 13 must remain constant whatever the first analog signal transmits. Logically, the input potential of the loop filter is equal to its exit potential divided by its gain taken to the first analog signal frequency, with the gain being low at high frequencies; now the quick discharge of the digital-to-analog converter attracts said loop filter towards high frequencies, therefore the input potential oscillates. It is said that the input voltage/current is impacted by noisy virtual ground. And that is how the performances of the delta-sigma analog-to-digital converter are degraded. To clean the noisy virtual ground in order to maintain the conversion resolution, the power consumption of the loop filter, then the power consumption of the delta-sigma analog-to-digital converter, should be increased.

A solution has been proposed which allows to just reduce the attraction of the loop filter towards high frequencies. More particularly, as mentioned in the Prior Art part of U.S. Pat. No. 7,151,474 and as illustrated on FIG. 3, it has been proposed to discharge the digital-to-analog converter via an additional resistance 17. Effectively, this solution allows to reduce the high frequency components of the third analog reference signal. Nonetheless, this solution is not satisfying because on the one hand the sensitivity of the delta-sigma analog-to-digital converter to clock jitter is consequently increased, on the other hand the less quick discharge of the switched-capacitor circuit can lead to the transmission of a charge error to the loop filter. These phenomena can be explained with more details as follow.

Logically, the discharge time of the digital-to-analog converter 121 depends on said additional resistance 17: the more the additional resistance increases (in order to greatly reduce said high frequency components of the third analog reference signal), the more the discharge time of the digital-to-analog converter increases. As illustrated on FIG. 4, when said discharge time becomes larger than the clock signal 102, the discharge of the digital-to-analog converter becomes incomplete before subsequent integration. Then a charge error 31 is transmitted to the loop filter, which in turn increases the sensitivity of the delta-sigma analog-to-digital converter to clock jitter 30.

Thus, such delta-sigma analog-to-digital converters do not allow to keep the clock jitter immunity, provided by the use of such digital-to-analog converter, without requiring an increase of their power consumption. Then, there is a need for a delta-sigma analog-to-digital converter which provides a satisfying trade-off between power consumption saving and clock jitter immunity.

SUMMARY OF THE INVENTION

It would be advantageous to achieve a delta-sigma analog-to-digital converter and a method for operating the same which alleviate one or more above mentioned drawbacks.

The first object of the present invention is achieved with a delta-sigma analog-to-digital converter for generating a digital signal as a function of a first analog signal and a clock signal having a first phase and a second phase, said converter comprises:
- a first branch on which is arranged an input resistance for applying a second analog input signal,
- a feedback branch for feeding back a third analog reference signal, said feedback branch including a digital-to-analog converter arranged for generating said third analog reference signal as a function of the digital signal,
- a loop filter for generating an integrated signal as a function of said first analog signal, said loop filter being coupled to a branch point of said first and feedback branches for receiving said first analog signal, and
- a quantizer for generating said digital signal as a function of said integrated signal, the quantizer being coupled to the loop filter for receiving the integrated signal and coupled to said feedback branch for delivering said digital signal to said digital-to-analog converter, characterized in that a switch is arranged on the first branch between the first resistance and said branch point, said switch being timely correlated with an output switch of the digital-to-analog converter in order for the delta-sigma analog-to-digital converter to switch between at least two configurations, a first one in which the input resistance is connected and the output of said digital-to-analog converter is disconnected during the first phase of clock signal and a second one in which the input resistance is disconnected and the output of said digital-to-analog converter is connected during the second phase of clock signal, said first analog signal being either said second analog input signal during the first phase of clock signal or said third analog reference signal during the second phase of clock signal.

Owing to said switch timely correlated with the output switch of the digital-to-analog converter, the delta-sigma analog-to-digital converter allows to maintain the immunity to clock jitter without increasing power consumption.

In a particular embodiment, the input resistance is fixed at an electrical resistance value which depends on the ratio between the duration of said first phase and the duration of said second phase of clock signal, in such a way that the shorter is the duration of said first phase, the less is the electrical resistance.

This particular embodiment allows to maintain a satisfying conversion resolution despite the disconnection of said input resistance during the second phase of clock signal.

In another particular embodiment, the loop filter is implemented using an active integrator.

In another particular embodiment, the digital-to-analog converter is implemented with a switched-capacitor circuit.

The present invention also relates to a method for operating a delta-sigma analog-to-digital converter for generating a digital signal as a function of a first analog signal and a clock signal having a first phase and a second phase, the method comprising:
- an input step consisting in inputting a second analog input signal through a first branch on which is arranged an input resistance,
- an integration step consisting in generating an integrated signal as a function of said first analog signal, this step being performed by a loop filter coupled to a branch point of said first and feedback branches for receiving said first analog signal,
- a quantification step consisting in generating said digital signal as a function of said integrated signal, this step being performed by a quantizer coupled to the loop filter for receiving the integrated signal and coupled to said feedback branch for delivering said digital signal to said digital-to-analog converter,
- a charging step for charging a third analog reference signal through a feedback branch, said feedback branch including a digital-to-analog converter arranged for generating said third analog reference signal as a function of said digital signal, and
- a discharging step for discharging the third analog reference signal through the feedback branch towards said branch point, characterized in that it further comprises a switching step consisting in switching the delta-sigma analog-to-digital converter between at least two configurations, a first one in which the input resistance is connected and the output of said digital-to-analog converter is disconnected during the first phase of clock signal and a second one in which the input resistance is disconnected and the output of said digital-to-analog converter is connected during the second phase of clock signal, said first analog signal being equal to either said second analog input signal during the first phase of clock signal or said third analog reference signal during the second phase of clock signal, this step being performed owing to a switch arranged on the first branch between the first resistance and said branch point and timely correlated with an output switch of said digital-to-analog converter.

In a particular embodiment, said second phase of clock signal is minimized to the time which is needed by the loop filter to damp out the oscillations of its input potential.

Advantageously, the method according to this particular embodiment allows to partially retrieve the anti-aliasing filter which has been lost due the switching step as disclosed above.

Depending on the type of image, a particular embodiment may be preferred as easier to adapt or as giving a better result. Aspects of these particular embodiments may be combined or modified as appropriate or desired, however.

BRIEF DESCRIPTION OF THE DRAWINGS

These and other aspects of the invention will be apparent from and elucidated with reference to the embodiment described hereafter where.

DETAILED DESCRIPTION

Figure 1:
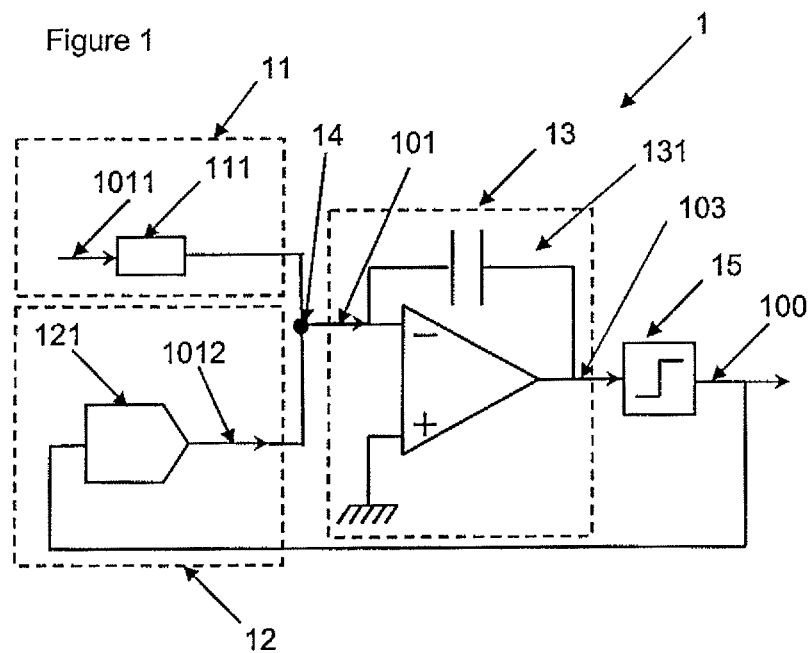
FIGS. 1, 2 and 3 are three schema each of which illustrates the electronic assembly of a delta-sigma analog-to-digital converter of prior art, FIG. 4 are four graphs which illustrate on the left hand side the discharge of the digital-to-analog converter including in the delta-sigma analog-to-digital converter as illustrated on FIG. 2, on the right hand side the discharge of the digital-to-analog converter including in the delta-sigma analog-to-digital converter as illustrated on FIG. 3, respectively with regard to an above graph which illustrates the clock signal and jitter.

While the invention has been illustrated and described in details in the drawings and foregoing description, such illustration and description are to be considered illustrative or exemplary and not restrictive; the invention is not limited to the disclosed embodiment.

Figure 2:
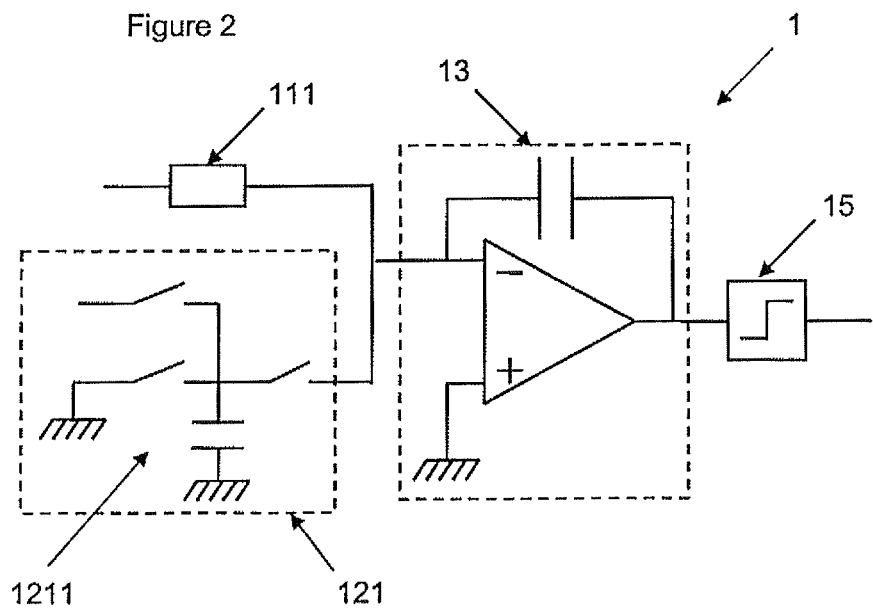
Figure 3:
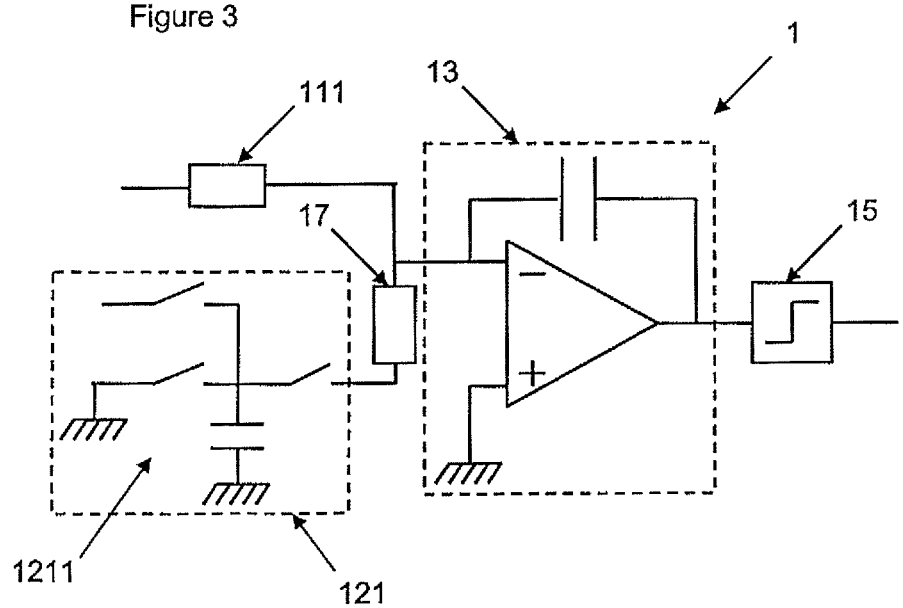
Figure 4:
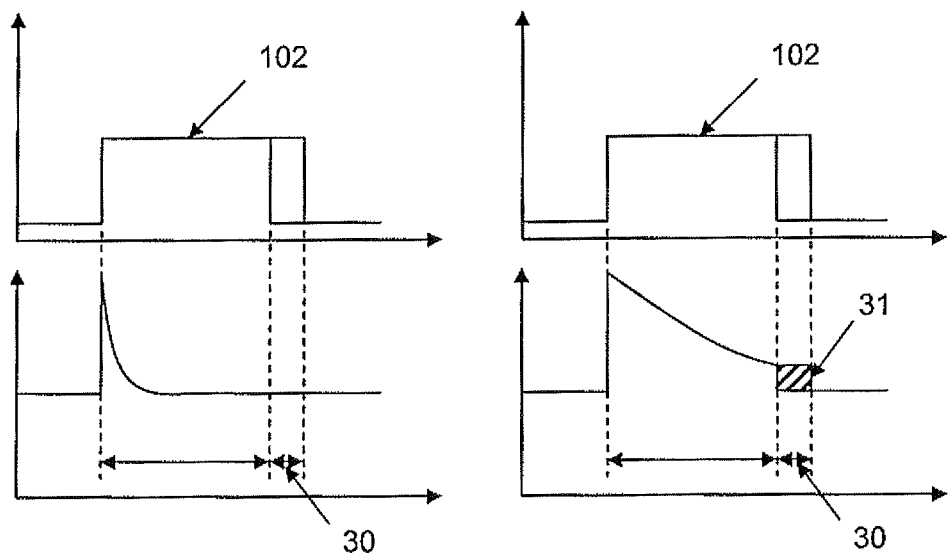

Delta-sigma analog-to-digital converters may be separated into two groups: a first group with the simplest converter which includes a single loop filter of first order and a 1 bit quantizer, and a second group of more complex converters. Such more complex converters can include a multiple loop filter or a single loop with multiple filters, of order higher than the first one, and "more than 1 bit" quantizer or a plurality of 1 bit quantizer. Obviously, the feedback operating has to be consistent with the operating and result of integration and quantification. Thus, a complex delta-sigma modulator implies a so complex feedback circuit. Said complex feedback circuit may include a digital-to-analog converter able to convert a "more than 1 bit" signal. Advantageously, the present delta-sigma analog-to-digital converter and method for operating the same may be utilized by both groups of converters which comprise any assembly of the components given in preamble of the claims. For the sake of simplicity, the present invention is described herein as applied to simplest converter architecture only. However, those skilled in the delta-sigma analog-to-digital converter art will appreciate that the present invention may also be applied to more complex converter architectures. An exemplary model of a delta-sigma analog-to-digital converter which includes a single loop filter of first order and a 1 bit quantizer is shown in FIGS. 1 and 2.

Delta-sigma analog-to-digital converters 1 are used for generating a digital signal 100 as a function of a first analog signal 101 and a clock signal 102. In the present case, said clock signal is suitably decomposed into a first phase 1021 and a second phase 1022.

Figure 5:
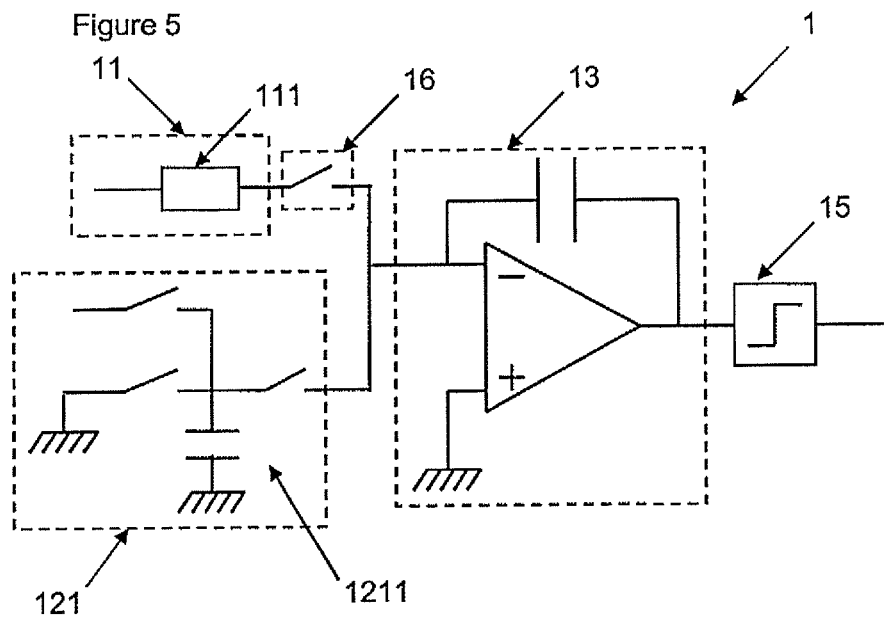
FIG. 5 is a scheme which illustrates the electronic assembly of a delta-sigma analog-to-digital converter according to the present invention, FIG. 6 are three graphs which illustrate respectively the time evolution of the second analog input signal, the time evolution of the current across the terminals of the switch as illustrated on FIG. 5 and the time evolution of the current across the terminals of the output switch of said digital-to-analog converter.

As shown in FIG. 5, the delta-sigma analog-to-digital converter 1 comprises a delta-sigma analog-to-digital modulator which in turn comprises a loop filter 13 and a quantizer 15. The first analog signal 101 is processed by the modulator in order to generate said digital signal 100. In the case illustrated on FIG. 5, the quantizer generates one bit which is logically equal to 0 or 1.

The delta-sigma analog-to-digital converter 1 further comprises a first branch 11. An input resistance 111 is arranged on said first branch and a second analog input signal 1011 is applied on said first branch across said input resistance.

The delta-sigma analog-to-digital converter 1 further comprises a feedback branch 12. Said feedback branch connects the output of said quantizer 15 to the input of said loop filter 13. A digital-to-analog converter 121 is arranged on said feedback branch in order to generate a third analog reference signal as a function of the digital signal 100 which is outputted from the quantizer. In an embodiment, said digital-to-analog converter 121 is implemented with a switched-capacitor circuit 1211. Thus said third analog reference signal 1012 is fed back to the input of said loop filter 13 through said switched-capacitor circuit 1211. Please note that said digital-to-analog converter can as well be implemented with a feedback current source.

Please note that said digital-to-analog converter 121 and said delta-sigma analog-to-digital modulator work with the same time period, this latter corresponding to said clock signal.

The delta-sigma analog-to-digital converter 1 further comprises a branch point 14 of said first and feedback branches.

The loop filter 13 is coupled to the branch point 14 for receiving said first analog signal 101 and generating an integrated signal as a function of said first analog signal. Please note that, in the case of a cascade of 'n' single loop delta-sigma analog-to-digital modulators, said integrated signal should be understood as a signal which has been integrated 'n' times.

In an embodiment, the loop filter 13 is more particularly implemented using an active integrator 131. Said active integrator comprises an operational amplifier and a capacitor, the capacitor being mounted between the output and one of the two inputs of the operational amplifier. Please note that the present invention is not concerned by analog-to-digital converters sampling the analog input signal with a switched-capacitor circuit also known as discrete-time analog-to-digital converters.

The quantizer 15 is coupled on the one hand to the loop filter for receiving the integrated signal 103, on the other hand to said feedback branch for delivering said digital signal to said digital-to-analog converter 121.

The switched-capacitor circuit comprises more particularly three switches, a capacitor and a second branch point of four branches. One first of these four branches comprises one first of said three switches connected to the ground. One second of these four branches comprises said capacitor connected to the ground. One third of these four branches comprises one second of said three switches, with this latter being connected to the output of said digital-to-analog converter 121; then said second switch of said three switches being the here above mentioned output switch of the digital-to-analog converter. The fourth of said four branches comprises the third switch of said three switches, this latter being connected to the branch point 14 of first and feedback branches.

The delta-sigma analog-to-digital converter 1 further comprises a switch 16 which is arranged on the first branch between the first resistance and said branch point 14. Said switch is timely correlated with the switched-capacitor circuit in order for the delta-sigma analog-to-digital converter to switch between at least two configurations. In a first configuration, on the one hand the switch 16 is closed in such a way that the input resistance is connected to said branch point 14, on the other hand the third switch of the switched-capacitor circuit is opened in such a way that said switched-capacitor circuit is disconnected from said branch point 14. This first configuration is the configuration of the delta-sigma analog-to-digital converter during the first phase of clock signal. In a second configuration, on the one hand the switch 16 is opened in such a way that the input resistance is disconnected from said branch point 14, on the other hand the third switch of the switched-capacitor circuit, or equivalently the output switch of said digital-to-analog converter, is closed in such a way that said switched-capacitor circuit is connected to said branch point 14. This second configuration is the configuration of the delta-sigma analog-to-digital converter during the second phase of clock signal. Thus, said first analog signal is equal to said second analog input signal during the first phase of clock signal or is equal to said third analog reference signal during the second phase of clock signal.

Please note that the switch 16 and the output switch of the digital-to-analog converter can be replace by a single switch with double throw arranged on the branch point 14, without discarding from the invention as claimed.

Figure 6:
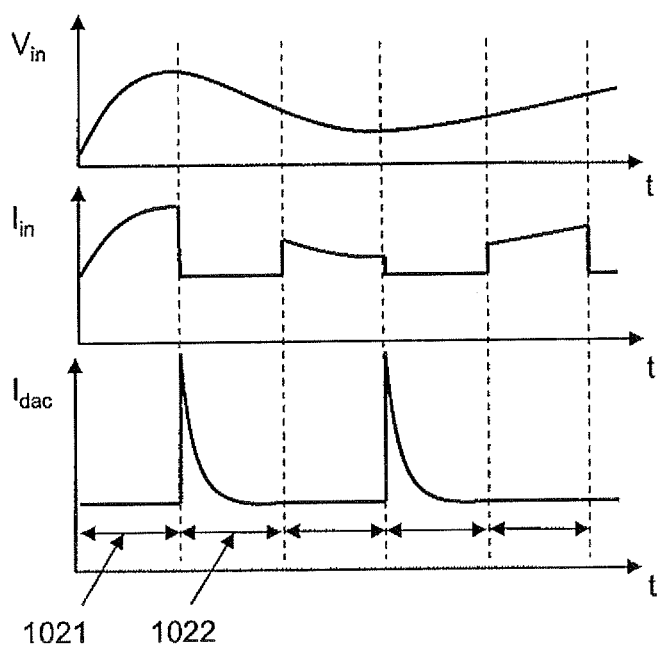

As illustrated in FIG. 6, the first phase corresponds to a phase during which the switched-capacitor circuit is charged with the electrical charge coming from the digital-to-analog converter as a consequence of the conversion of the digital signal obtained at the previous integration. Equivalently, the first phase corresponds to a phase during which the input current $I_{in}$ which corresponds to said second analog input signal is applied through the closed switch 16 to the input of the loop filter. The second phase corresponds to a phase during which the electrical charge $I_{dac}$ previously charged into the switched-capacitor circuit is discharged into the loop filter. Equivalently, the second phase corresponds to a phase during which the input current which corresponds to said second analog input signal is null.

In an embodiment, the input resistance 111 is fixed at an electrical resistance value which depends on the ratio between the duration of said first phase 1021 and the duration of said second phase 1022 of clock signal 102. More particularly, the shorter is the duration of said first phase, the less is the electrical resistance.

This particular embodiment allows to maintain a satisfying conversion resolution despite the disconnection of said input resistance during the second phase of clock signal. This can be explained as follow. Logically, said input current is equal to the input potential $V_{in}$ divided by the electrical resistance value of the input resistance 111. Moreover, the result of the integration logically depends on the quantity of electrical charges which have been transferred to the loop filter during said first phase, with this quantity depending on the input current which in turn depends on the input resistance. Thus, reducing the electrical resistance value of said input resistance when the time dedicated for inputting the second analog input signal as the first analog signal allows to transmit a sufficient quantity of charges for the integration and in consequence allows to maintain a high conversion resolution.

Figure 7:
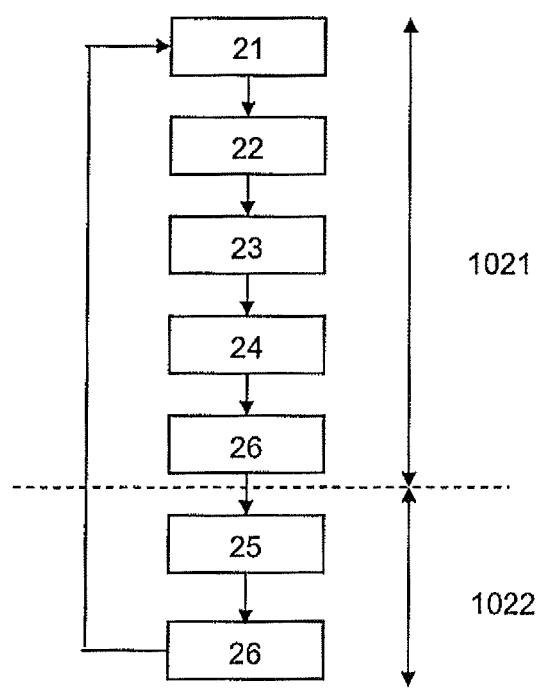
FIG. 7 is a flowchart which illustrates the method according to the present invention.

The method for operating the delta-sigma analog-to-digital converter 1 according to the present invention is illustrated on FIG. 7.

We consider that the delta-sigma analog-to-digital converter 1 is in a first configuration in which the input resistance is connected and the switched-capacitor circuit is disconnected. As already disclosed above, we define that this configuration occurs during the first phase of clock signal.

The method comprises an input step 21 for inputting the second analog input signal 1011 through the first branch 11 on which is arranged an input resistance 111.

The method further comprises an integration step 22 for generating an integrated signal 103 as a function of said first analog signal 101, with said first analog signal being equal to said second analog input signal. This integration step is performed by the loop filter.

The method further comprises a quantification step 23 for generating said digital signal as a function of said integrated signal. This step is performed by the quantizer 15.

The method further comprises a charging step 24 during which said digital signal is transmitted to the digital-to-analog converter arranged on the feedback branch 12. Said digital-to-analog converter converts said digital signal into the third analog reference signal 1012, for instance through the closed second switch of the switched-capacitor circuit.

In order to illustrate the operating of the switched-capacitor circuit, we consider hereafter that the above mentioned input of the loop filter 13 is connected to the inverting input of the operational amplifier therein. This case is also illustrated in FIG. 5. If the digital signal consists in a bit equal to 1, the first switch of the switched-capacitor circuit is consequently closed in order to discharge the third analog reference signal into the ground and bring the third analog reference signal to zero. If the digital signal consists in a bit equal to 0, the first switch of the switched-capacitor circuit is consequently opened in order to charge the capacitor of the switched-capacitor circuit with the third analog reference signal. Once the discharge of the third analog reference signal in the ground or the charge of the capacitor of the switched-capacitor circuit is done, the second switch is opened.

Said input, integration, quantification and charging steps (21, 22, 23 and 24, respectively) occur in the same time during the first phase of clock signal.

The method further comprises a switch step 26. This switch step consists in switching the delta-sigma analog-to-digital converter 1 from its first configuration in which the input resistance is connected and the switched-capacitor circuit is disconnected during the first phase of clock signal into a second configuration in which the input resistance is disconnected and the switched-capacitor circuit is connected during the second phase of clock signal. The switched-capacitor circuit being connected, the third analog is inputted into the loop filter during a discharging step 25. At the same time, the switch 16 is opened and the input current through the first branch is brought to zero. Said first analog signal is thus equal to said third analog reference signal during the second phase of clock signal. In this manner, the input potential of said loop filter is bring to the reference potential during the second phase of clock signal.

Then, the method provides a second switch step 26 which consists in switching the delta-sigma analog-to-digital converter 1 from its second configuration into its first configuration. The first analog signal is equal to the second analog input signal which is thus integrated with reference to the previously integrated third analog signal, then quantized and fed back, and so on.

In an embodiment, the duration of the second phase is the longer of two time periods. These two time periods are either the time period needed to discharge said digital-to-analog converter or the time period needed to damp out the oscillations of its input potential. The ability of the loop filter 13, or more particularly the ability of the operational amplifier, to damp out said oscillations depends on its power supply. Then, a satisfying trade-off has to be found according to the features of each electronic component, the aim remaining to not increase significantly the power consumption of the delta-sigma analog-to-digital converter 1. Obviously, the second phase of clock signal being minimized, its first phase is consequently maximized in order to keep the highest conversion resolution.

Other variations to the disclosed embodiments can be understood and effected by those skilled in the art in practicing the claimed invention, from a study of the drawings, the disclosure and the appended claims. In the claims, the word "comprising" does not exclude other elements and the indefinite article "a" or "an" does not exclude a plurality.

The invention claimed is:

1. A delta-sigma analog-to-digital converter for generating a digital signal as a function of a first analog signal and a clock signal having a first phase and a second phase, the converter comprising:
   a first branch operative to apply input resistance to a second analog input signal;
   a feedback branch operative to feed back a third analog reference signal, the feedback branch including a digital-to-analog converter configured to generate the third analog reference signal as a function of the digital signal;
   a loop filter configured to generate an integrated signal as a function of the first analog signal, the loop filter being coupled to a branch point of the first branch and the feedback branch, for receiving the first analog signal; and
   a quantizer configured to generate the digital signal as a function of the integrated signal, the quantizer being coupled to the loop filter for receiving the integrated signal and coupled to the feedback branch for delivering the digital signal to the digital-to-analog converter; and
   a switch arranged on the first branch between the input resistance and the branch point, the switch being timely correlated with an output switch of the digital-to-analog converter in order for the delta-sigma analog-to-digital converter to switch between at least two configurations, comprising:
      a first configuration in which the input resistance is connected and the output of the digital-to-analog converter is disconnected during the first phase of clock signal; and
      a second configuration in which the input resistance is disconnected and the output of the digital-to-analog converter is connected during the second phase of clock signal, the first analog signal being equal to either the second analog input signal during the first phase of clock signal or the third analog reference signal during the second phase of clock signal;
   wherein the input resistance is fixed at an electrical resistance value which depends on a ratio between a duration of the first phase and a duration of the second phase of the clock signal, such that a shorter duration of the first phase yields a lower electrical resistance value.

2. The delta-sigma analog-to-digital converter of claim 1, wherein the loop filter is implemented using an active integrator.

3. The delta-sigma analog-to-digital converter of claim 1, wherein the digital-to-analog converter is implemented with a switched-capacitor circuit.

4. A method of operating a delta-sigma analog-to-digital converter to generate a digital signal as a function of a first analog signal, and a clock signal having a first phase and a second phase, the method comprising:

inputting a second analog input signal through a first branch that includes an input resistance;

generating an integrated signal as a function of the first analog signal, wherein the integrated signal is generated by a loop filter coupled to a branch point of the first branch and the feedback branch for receiving the first analog signal;

generating the digital signal as a function of the integrated signal, wherein the digital signal is generated by a quantizer coupled to the loop filter for receiving the integrated signal and coupled to the feedback branch for delivering the digital signal to a digital-to-analog converter;

charging a third analog reference signal through a feedback branch, the feedback branch including the digital-to-analog converter, the digital-to-analog converter being configured to generate the third analog reference signal as a function of the digital signal; and discharging the third analog reference signal through the feedback branch towards the branch point;

operating a switch that is arranged on the first branch between the input resistance and the branch point and is and timely correlated with an output switch of the digital-to-analog converter, to switch the delta-sigma analog-to-digital converter between at least two configurations, comprising:

a first configuration in which the input resistance is connected and the output of the digital-to-analog converter is disconnected during the first phase of clock signal; and a second configuration in which the input resistance is disconnected and the output of the digital-to-analog converter is connected during the second phase of clock signal, the first analog signal being equal to either the second analog input signal during the first phase of clock signal or the third analog reference signal during the second phase of clock signal; and fixing the input resistance at an electrical resistance value which depends on a ratio between a duration of the first phase and a duration of the second phase of the clock signal, such that a shorter duration of the first phase yields a lower electrical resistance value.

5. The method of claim 4, further comprising:

setting the second phase of the clock signal to a minimum time needed for the loop filter to damp out the oscillations of its input potential.

* * * * *